(12) United States Patent
Nakamura

(10) Patent No.: US 7,222,421 B2
(45) Date of Patent: May 29, 2007

(54) CIRCUIT SUBSTRATE MANUFACTURING METHOD

(75) Inventor: Junichi Nakamura, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 73 days.

(21) Appl. No.: 11/034,985

(22) Filed: Jan. 14, 2005

(65) Prior Publication Data
US 2005/0155222 A1 Jul. 21, 2005

(30) Foreign Application Priority Data
Jan. 19, 2004 (JP) ............... 2004-010467
Jun. 1, 2004 (JP) ............... 2004-162913

(51) Int. Cl.
*H05K 3/36* (2006.01)
(52) U.S. Cl. .............. 29/830; 29/846; 29/847; 29/831; 156/248; 174/259
(58) Field of Classification Search ........... 29/825, 29/829, 830, 846, 847, 852; 174/259, 261; 216/18, 20; 361/751; 156/247, 148, 248
See application file for complete search history.

(56) References Cited

U.S. PATENT DOCUMENTS

| 5,495,665 | A | * | 3/1996 | Carpenter et al. | ........... 29/830 |
| 5,505,321 | A | * | 4/1996 | Caron et al. | ........... 216/20 |
| 6,418,615 | B1 | | 7/2002 | Rokugawa et al. | |
| 6,772,515 | B2 | * | 8/2004 | Suwa et al. | ........... 29/847 |
| 2002/0001937 | A1 | | 1/2002 | Kikuchi et al. | |
| 2003/0080409 | A1 | | 5/2003 | Nakamura et al. | |

FOREIGN PATENT DOCUMENTS

| JP | 2000-323613 | 11/2000 |
| JP | 2002-83893 | 3/2002 |
| JP | 2003-142617 | 5/2003 |

\* cited by examiner

*Primary Examiner*—Minh Trinh
*Assistant Examiner*—Donghai D. Nguyen
(74) *Attorney, Agent, or Firm*—Armstrong, Kratz, Quintos, Hanson & Brooks, LLP

(57) ABSTRACT

A circuit substrate manufacturing method including the steps of preparing a substrate on which a metallic foil is formed in a releasable state, forming a build-up wiring on the metallic foil, obtaining a circuit member having a structure that the build-up wiring is formed on the metallic foil by releasing the metallic foil from the substrate, and exposing a lowest wiring layer of the build-up wiring by removing the metallic foil of the circuit member.

4 Claims, 11 Drawing Sheets

CIRCUIT SUBSTRATE MANUFACTURING METHOD

BACKGROUND OF THE INVENTION

1. Field of the Invention

The present invention relates to a circuit substrate manufacturing method and, more particularly, a circuit substrate manufacturing method applicable to a package substrate of electronic parts.

2. Description of the Related Art

As the method of manufacturing the circuit substrate into which electronic parts are packaged, in Patent Literature 1 (Patent Application Publication (KOKAI) 2000-323613), there is set forth the method of manufacturing the circuit substrate by forming the predetermined build-up multi-layered wiring on one surface of the copper plate, and then removing selectively the copper plate. Also, in Patent Literature 2 (Patent Application Publication (KOKAI) 2003-142617), there is set forth the method of manufacturing the circuit substrate by pasting two sheets of copper plate together via the adhesive applied to their peripheral portions, then forming the predetermined build-up multi-layered wiring on both surfaces respectively, then separating their peripheral portions of the copper plate from the main body of the copper plate to separate two sheets of copper plate, and then removing selectively the copper plates respectively.

In addition, in Patent Literature 3 (Patent Application Publication (KOKAI) 2002-83893), there is set forth the method of manufacturing the circuit substrate, from which wirings to which the semiconductor elements are connected are exposed, by forming the predetermined build-up multi-layered wiring on both surfaces of the metal bases respectively, then cutting the metal bases along a surface that is in parallel to the surfaces to separate the metal bases into two parts, and then removing partially respective metal bases.

However, according to the manufacturing methods in connection with Patent Literatures 1 to 3, since the relatively heavy copper plate is used as the substrate, various troubles are caused readily in the manufacturing steps. For example, according to the manufacturing method in connection with Patent Literature 2, since two sheets of copper plate each having an area of 50×50 cm$^2$ and a thickness of 0.4 mm are used, its weight becomes heavy such as about 1.8 kg when two sheets of copper plate are pasted together. Therefore, the workability in handling the copper plate is wrong and also the heavy copper plate must be carried in the manufacturing steps, and as a result the trouble is easily caused in the conveyer system.

Also, it is preferable that, since the copper plate is removed finally, its thickness should be made thin. However, if its thickness is too small, its elasticity and its rigidity are weakened and thus the troubles such as generation of the crack in carrying, etc, are caused. On the contrary, if its thickness of the copper plate is made thick, an amount etched in removing the copper plate is increase and an increase in cost is brought about.

In addition, according to the manufacturing method in connection with Patent Literature 2, the peripheral portions (e.g., almost 3 cm), onto which the adhesive is applied, out of two sheets of copper plate are destroyed as the so-called margin for pasting. Therefore, the overall copper plate cannot be effectively utilized and thus the case where such method becomes disadvantageous in the productivity is assumed.

SUMMARY OF THE INVENTION

It is an object of the present invention to provide a circuit substrate manufacturing method capable of manufacturing a circuit substrate at a low cost without any trouble in the manufacturing process.

The present invention is concerned with a circuit substrate manufacturing method that comprises the steps of preparing a substrate on which a metallic foil is formed in a releasable state on at least one surface of the substrate: forming a build-up wiring on the metallic foil: obtaining a circuit member having a structure that the build-up wiring is formed on the metallic foil by releasing the metallic foil from the substrate: and exposing a lowest wiring layer of the build-up wiring by removing the metallic foil of the circuit member.

In the present invention, as the base substrate used to fabricate the circuit substrate, the substrate (the resin, or the like) on which the metallic foil (the copper foil, or the like) is formed in a releasable state is used. Therefore, since weight reduction can be achieved remarkably rather than the case where the heavy copper plate is used like the prior art, the workability can be improved and also generation of the troubles in carrying the base substrate by the conveyer system can be prevented.

Then, the build-up wiring is formed on the metallic foil of the base substrate, and then the metallic foil is released from the substrate. Thus, the circuit member having a structure that the build-up wiring is formed on the metallic foil is obtained. Then, the metallic foil of the circuit member is removed selectively with respect to the build-up wiring to expose the lowest wiring pattern of the build-up wiring, and thus the circuit substrate is obtained. The lowest wiring pattern of the circuit substrate acts as the bumps, for example, and is connected to the electronic parts (the semiconductor chip, or the like) mounted on the circuit substrate.

Preferably, in the step of forming the build-up wiring, an insulating film, in which opening portions are provided in predetermined portions, is formed on the metallic foil of the base substrate, and then the concave portions are formed in portions of the metallic foil in the opening portions. Then, the metal layer (the solder layer, or the like) is formed in the concave portions and the opening portions by the electro-plating utilizing the metallic foil as the plating power-feeding layer. Then, wiring patterns, which are connected to the metal layer via the opening portions, are formed on the insulating film.

In the present invention, the circuit substrate is obtained by forming the metal layer serving as the bumps and the wiring patterns connected thereto on the thin film metallic foil (a thickness is set to 30 to 40 μm, for example) and then removing selectively the metallic foil. Therefore, an amount etched can be reduced remarkably in contrast to the case where the copper plate (a thickness is 0.4 mm) used in the prior art, and reduction in cost can be attained largely.

In addition, unlike the method by which two sheets of copper plate whose peripheral portions are pasted together are used in the prior art, in the case where the metal layer and the wiring patterns connected thereto are formed on both surface sides of the base substrate, no portion of the base substrate is disposed and thus the overall area of the base substrate can be utilized effectively, and therefore the productivity can be improved.

Also, the present invention is concerned with a circuit substrate manufacturing method that comprises the steps of preparing a substrate on at least one surface of which a metallic foil is formed in a releasable state; forming an insulating film in which opening portions are provided on the metallic foil; forming first wiring patterns, which are electrically connected to the metallic foil via the opening portions, on the insulating film; obtaining a circuit member, which is constructed by the metallic foil, the insulating film, and the first wiring patterns, by releasing the metallic foil from the substrate; and forming second wiring patterns, which are connected electrically to the first wiring patterns via the opening portions in the insulating film, on an opposite surface of the insulating film to a surface, on which the first wiring patterns are formed, by patterning the metallic foil of the circuit member.

In the present invention, the predetermined build-up wiring is formed on the metallic foil that is provided on the substrate (the resin, or the like) in a releasable state. Then, the metallic foil is released from the substrate, whereby the circuit member to one surface of which the build-up wiring is provided and to the other surface of which the metallic foil is provided is obtained. Then, the metallic foil of the circuit member is patterned to form the wiring patterns that are connected to the build-up wiring.

In this manner, like the above invention, since the weight reduction of the substrate can be achieved, the workability can be improved and also generation of the trouble in carrying the base substrate by the conveyer system can be prevented. Also, in the present invention, since the metallic foil is not removed finally but utilized effectively as the wiring patterns, the reduction in cost can be further attained.

As described above, in the present invention, the circuit substrate can be manufactured at a low cost without any trouble in the manufacturing steps.

DETAILED DESCRIPTION OF THE PREFERRED EMBODIMENTS

Embodiments of the present invention will be explained with reference to the accompanying drawings hereinafter.

First Embodiment

FIGS. 1A to 1L are sectional views showing a circuit substrate manufacturing method according to a first embodiment of the present invention in seriatim.

Figure 1A:
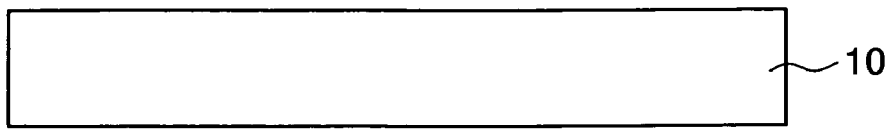
FIGS. 1A to 1L are sectional views showing a circuit substrate manufacturing method according to a first embodiment of the present invention.
Figure 1B:
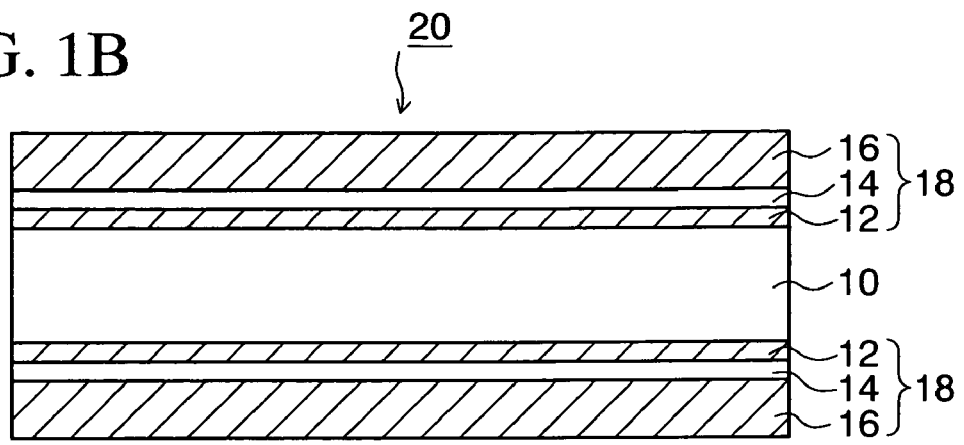

As shown in FIG. 1A, first a resin substrate 10 such as a glass epoxy resin, or the like is prepared. Then, as shown in FIG. 1B, a carrier-backed copper foil 18 having such a structure that a carrier copper foil 16 of 30 to 40 μm thickness is pasted onto a thin film copper foil 12 of 3 to 5 μm thickness via a released layer (adhesive layer) 14 is prepared. The carrier copper foil 16 is provided as a supporting member that facilitates the handling of the thin film copper foil 12.

Then, as similarly shown in FIG. 1B, an exposed surface of the thin film copper foil 12 of the carrier-backed copper foil 18 is pasted onto both surfaces of the resin substrate 10 respectively. At this time, the bump-like unevenness is provided to the exposed surface of the thin film copper foil 12 of the carrier-backed copper foil 18. Therefore, the carrier-backed copper foil 18 can be pasted onto the resin substrate 10 in the good adhesive condition by the so-called anchoring effect since the unevenness on the copper foil 18 bites into the resin substrate 10. Meanwhile, since the thin film copper foil 12 and the carrier copper foil 16 are pasted together via the released layer 14, the carrier copper foil 16 can be easily released from a boundary surface of the released layer 14.

In the present embodiment, a structural body in FIG. 1B is used as a base substrate 20. Since the base substrate 20 according to the present embodiment is constructed by pasting the carrier-backed copper foil 18 onto the resin substrate 10, weight reduction can be achieved remarkably rather than the copper plate used in the prior art. Thus, the handling of the base substrate 20 can be facilitated to improve the workability, and also generation of the troubles in carrying the base substrate 20 by means of the conveyer system can be prevented.

Figure 1C:
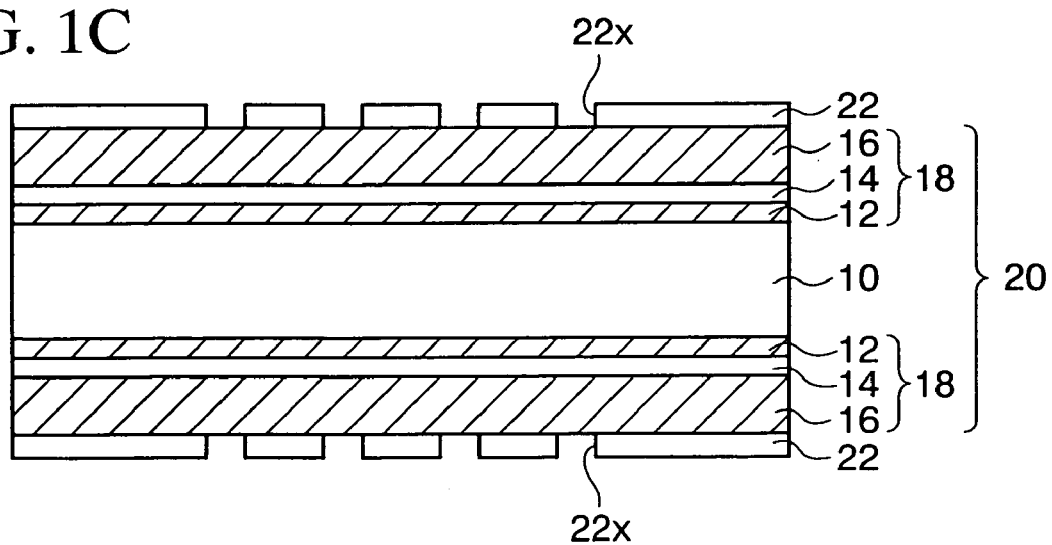

Then, build-up multi-layered wirings are formed on both surfaces of such base substrate 20. In other words, as shown in FIG. 1C, first a first insulating film 22 in which opening portions 22x are provided to predetermined portions is formed on the carrier copper foil 16 on both sides of the base substrate 20 respectively. As the material of the first insulating film 22, epoxy resin, polyimide resin, novolac resin, acrylic resin, or the like may be employed. As the method of forming the first insulating film 22, there is the method of patterning a photosensitive resin film by virtue of the photolithography. Otherwise, there may be employed the method of forming the resin film by laminating the film-like resin or by virtue of the spin coating or the printing, and then forming the opening portions by etching this resin film by virtue of the laser or the RIE. Alternately, there may be employed the method of forming the opening portions by die-cutting predetermined portions of the film-like resin, and then pasting this resin film. In addition, the resin film in which the opening portions are provided may be patterned by virtue of the screen printing.

Figure 1D:
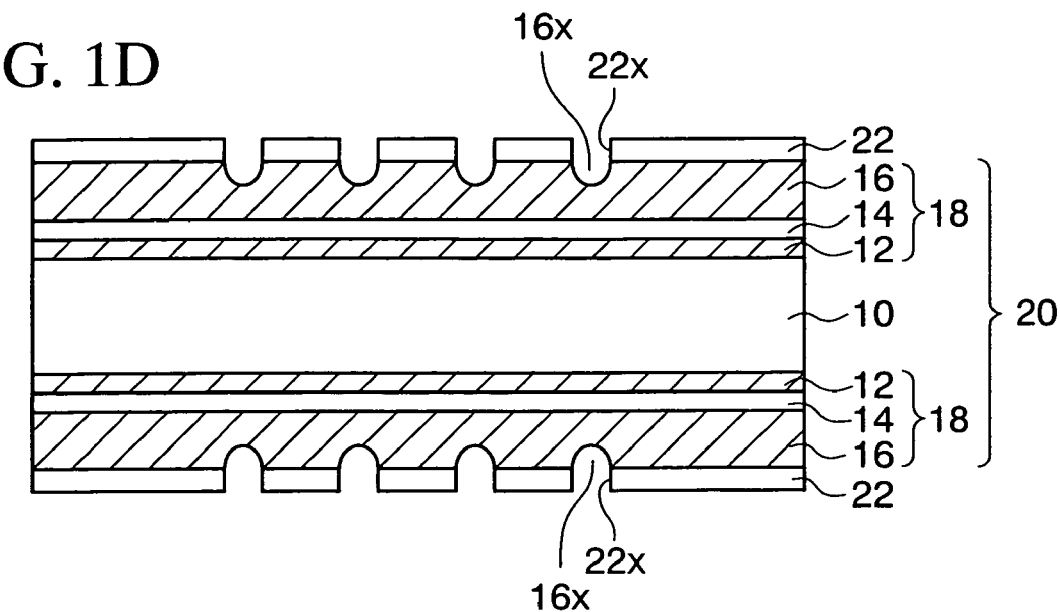

Then, as shown in FIG. 1D, concave portions 16x are formed by etching portions, which are exposed from the opening portions 22x of the first insulating film 22, out of the carrier copper foil 16.

Figure 1E:
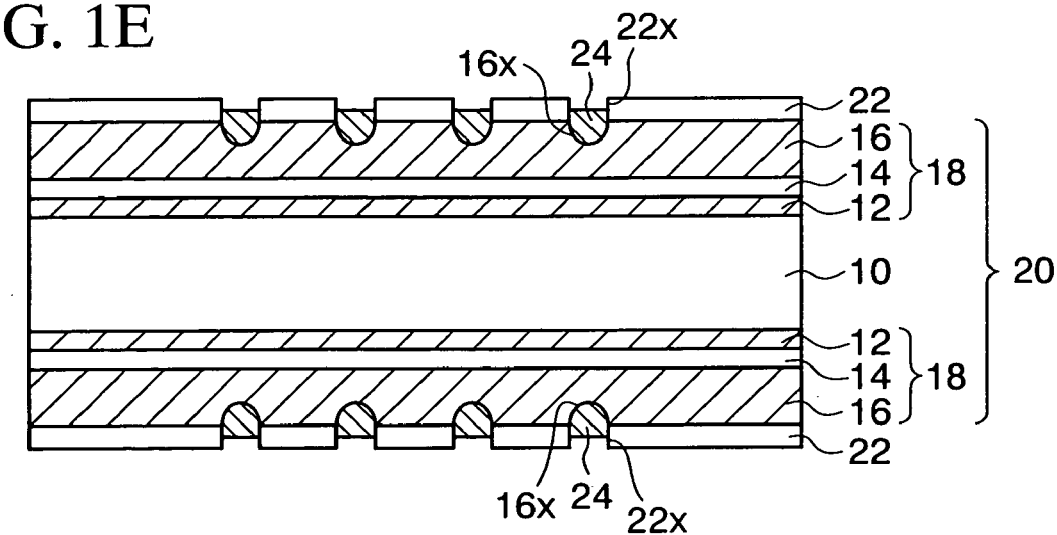

Then, as shown in FIG. 1E, a solder layer 24 is formed in the concave portions 16x of the carrier copper foil 16 and a part of the opening portions 22x of the first insulating film 22 on both surfaces sides of the base substrate 20 respectively, while using the electroplating utilizing the carrier copper foil 16 as the plating power-feeding layer. Here, since the carrier copper foil 16 is removed finally by the etching, as described later, the metal that has the resistance against the etching applied to the carrier copper foil 16 is chosen as the material of the metal layer formed on the carrier copper foil 16. As such metal material, there are gold (Au), and the like in addition to solder.

Figure 1F:
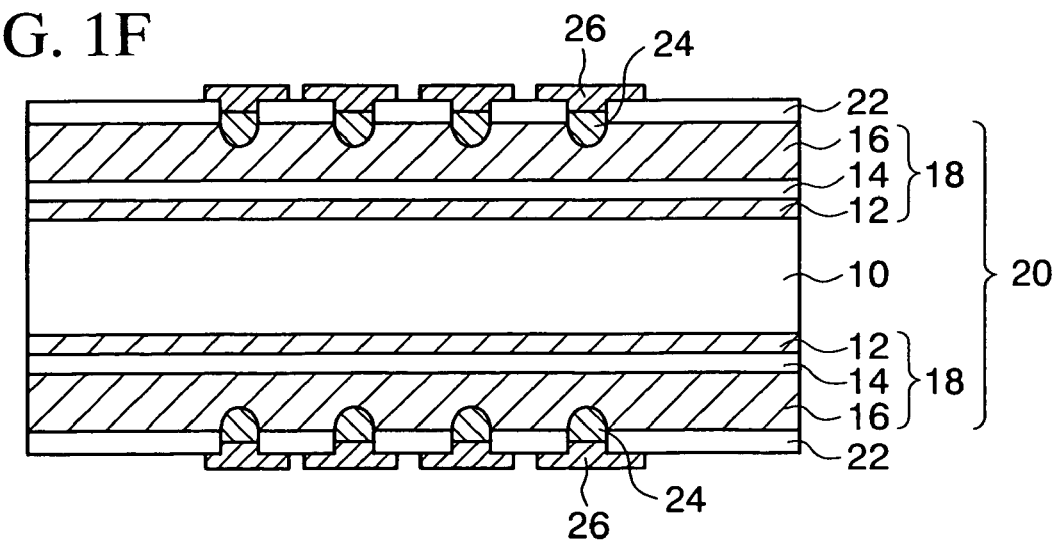

Then, as shown in FIG. 1F, a first wiring pattern 26 connected to the solder layer 24 is formed on the first insulating film 22 on both surfaces sides of the resin substrate 10 respectively. The first wiring pattern 26 is formed by the semi-additive process, for example. In more detail, first a Cu seed layer (not shown) is formed by the electroless plating or the sputter method, and then a resist film (not shown) having opening portions that are aligned with the first wiring patterns 26 is formed. Then, Cu film patterns (not shown) are formed in the opening portions in the resist film by the electroplating utilizing the Cu seed layer as the plating power-feeding layer. Then, the resist film is removed and then the Cu seed layer is etched by using the Cu film patterns as a mask. Thus, the first wiring patterns 26 are obtained.

Figure 1G:
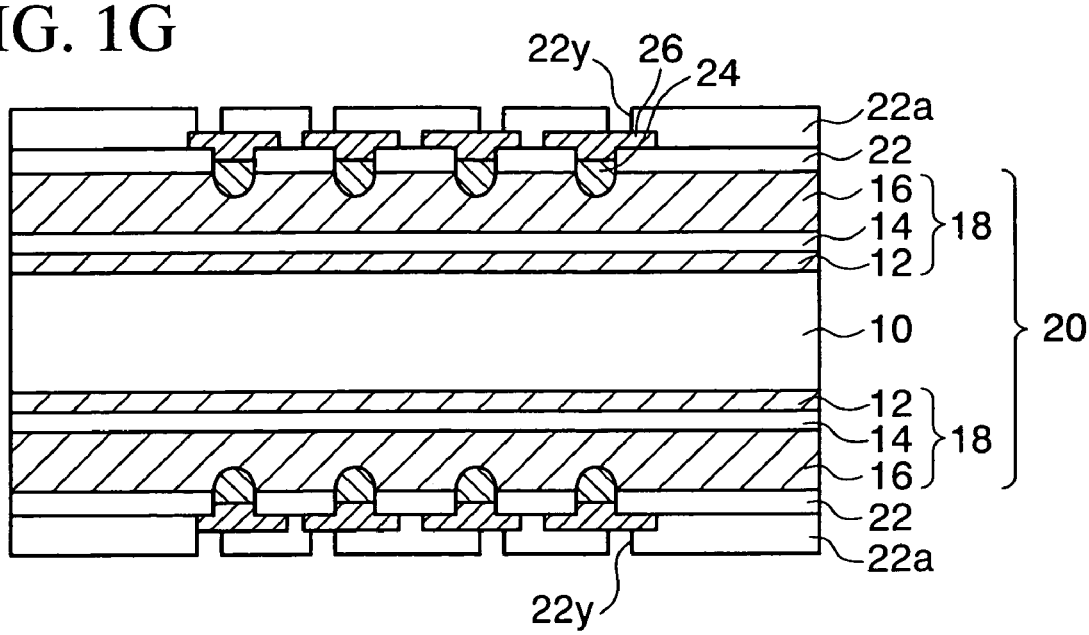

Then, as shown in FIG. 1G, a second insulating film 22a in which a via hole 22y is formed on the first wiring patterns 26 respectively is formed on both surface sides of the base substrate 20 respectively. The second insulating film 22a is formed by the similar method to that applied to the above the first insulating film 22. Then, as shown in FIG. 1H, a second wiring pattern 26a that is connected to the first wiring patterns 26 via the via hole 22y is formed on the second insulating film 22a on both surface sides of the base substrate 20 respectively, while using the similar method to the method of forming the above first wiring patterns 26.

With the above, the build-up wiring containing the solder layers 24 is formed on the carrier copper foil 16. In FIG. 1H, a mode in which two-layered first and second wiring patterns 26, 26a being connected to the solder layers 24 are formed is illustrated. But a mode in which an n-layered (n is an integer that is 1 or more) wiring pattern is formed may be employed.

Figure 1H:
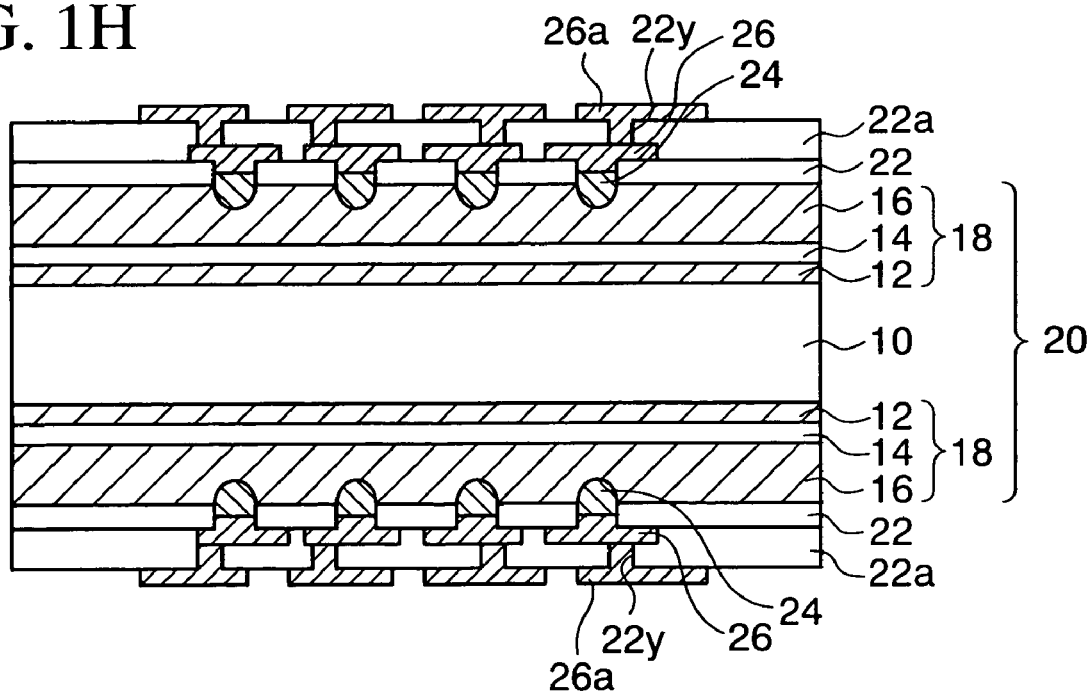
Figure 1I:
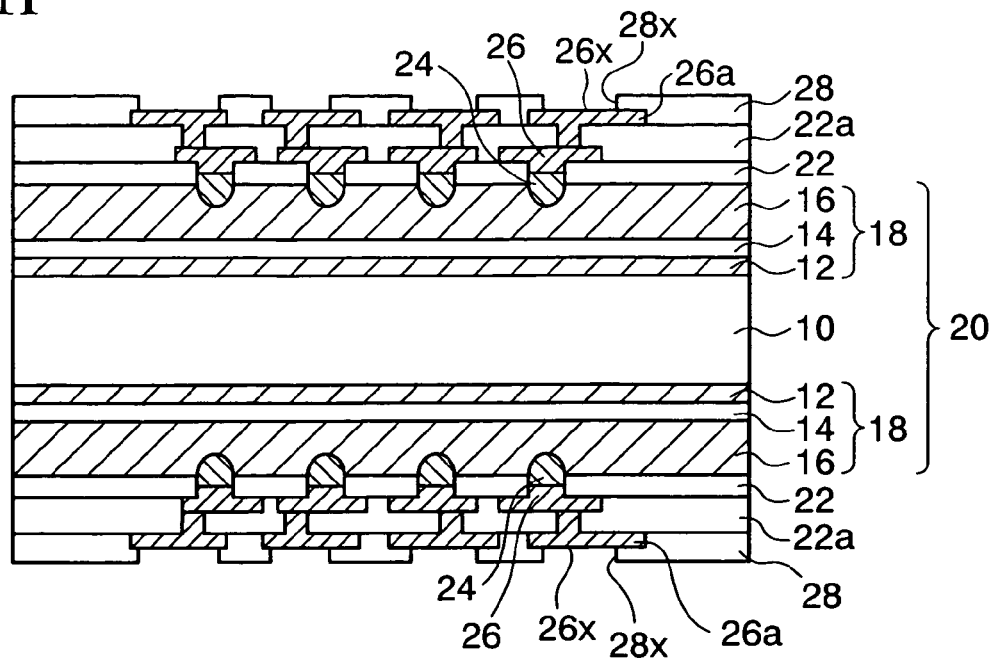

Then, as shown in FIG. 1I, a solder resist film 28 in which opening portions 28x to expose connection portions 26x of the second wiring patterns 26a on both surface sides of the base substrate 20 respectively are formed is formed on both surfaces of the resultant structure in FIG. 1H respectively.

Figure 1J:
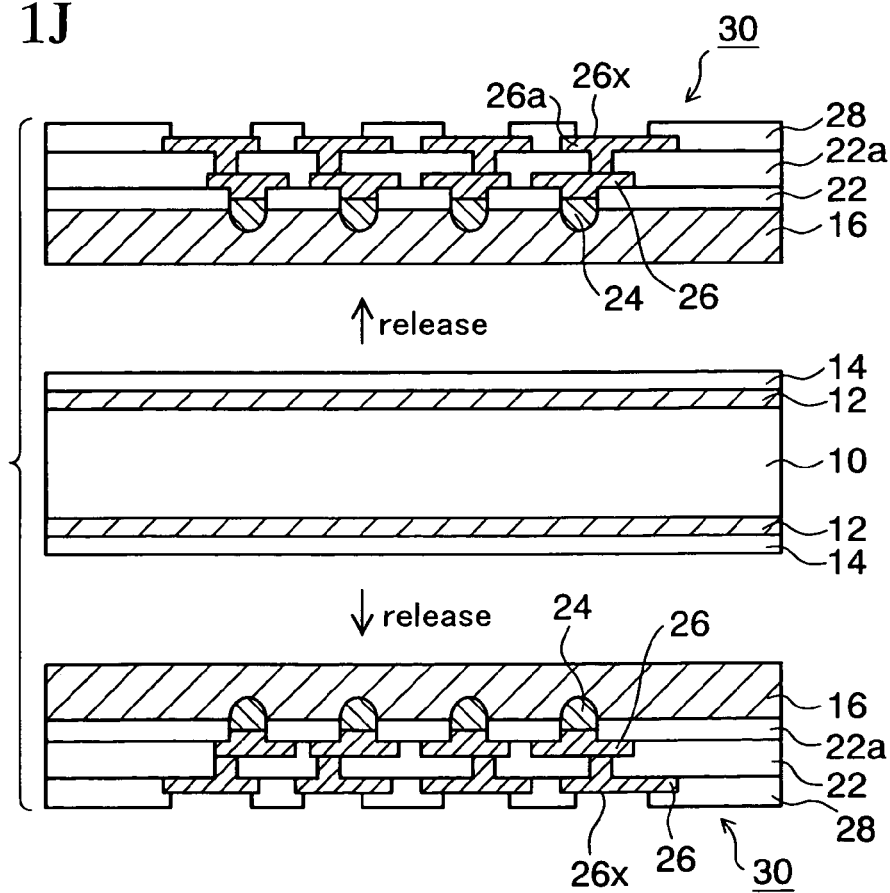
Figure 1K:
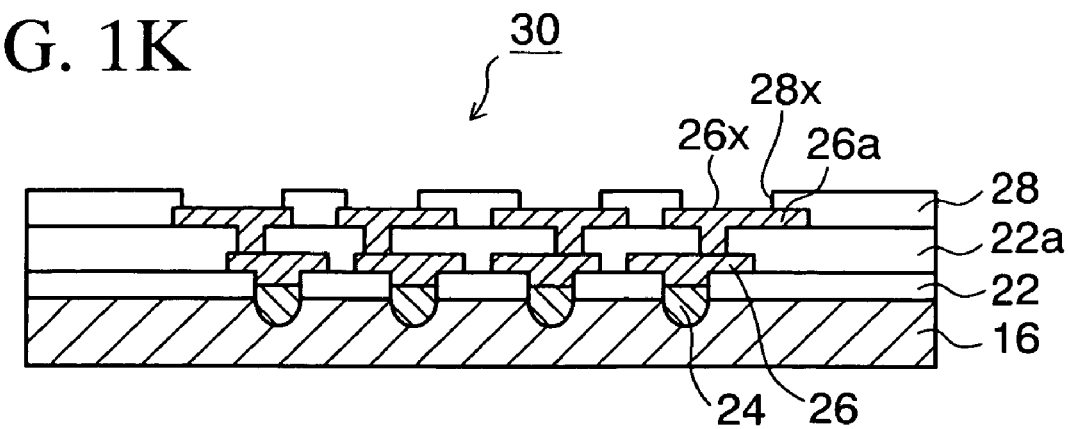

Then, as shown in FIG. 1J, the carrier copper foil 16 on both surface sides of the resin substrate 10 is released from a boundary surface to the released layer 14 respectively. Thus, the carrier copper foil 16 is separated from the resin substrate 10. As a result, as shown in FIG. 1K, a circuit member 30 having such a structure that a build-up wiring containing the solder layers 24 is formed on the carrier copper foil 16 is obtained.

Figure 1L:
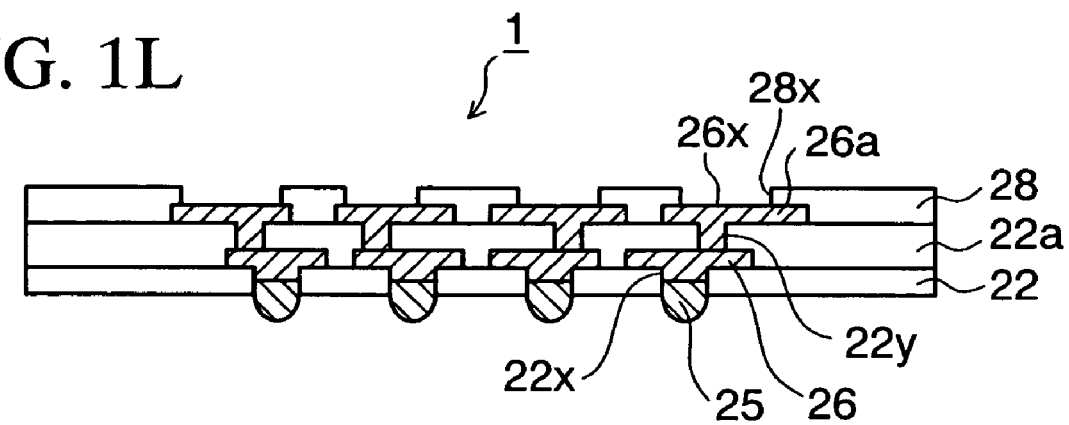

Then, as shown in FIG. 1L, the carrier copper foil 16 of the circuit member 30 is selectively removed with respect to the solder layers 24 and the first insulating film 22. For example, the carrier copper foil 16 can be selectively removed with respect to the solder layers 24 and the first insulating film 22 by the wet etching utilizing an iron (III) chloride aqueous solution, a copper (II) chloride aqueous solution, an ammonium persulfate aqueous solution, or the like.

Thus, the solder layers 24 connected to bottom surfaces of the first wiring patterns 26 are exposed to serve as bumps 25, whereby a circuit substrate 1 in the first embodiment is obtained.

Figure 2:
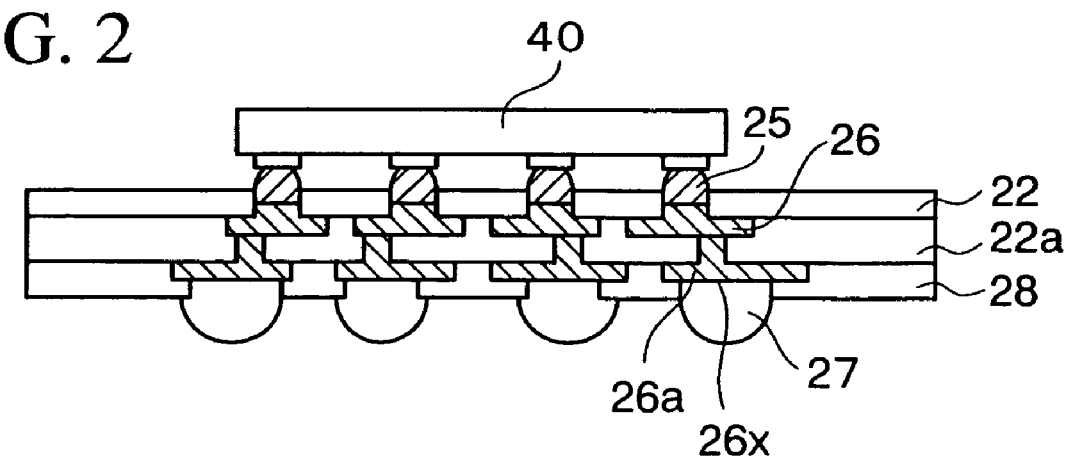
FIG. 2 is a sectional view showing an example in which the circuit substrate in the first embodiment of the present invention is employed in an electronic parts package.

FIG. 2 is a sectional view showing an example in which the circuit substrate in the first embodiment of the present invention is employed in an electronic parts package.

As shown in FIG. 2, the circuit substrate 1 of the present embodiment is used as the electronic parts package, an electronic parts 40 such as a semiconductor chip, or the like is connected to the bumps 25 of the circuit substrate 1 and also external connection terminals 27 are provided on the connection portions 26x of the second wiring patterns 26a. In FIG. 2, a mode in which the circuit substrate 1 is used as the BGA (Ball Grid Array) type is illustrated. In this case, the external connection terminals 27 are composed of the solder balls. Also, when the circuit substrate 1 is used as the PGA (Pin Grid Array) type, the lead pins are connected to the connection portions 26x of the second wiring patterns 26a. Also, when the circuit substrate 1 is used as the LGA (Land Grid Array) type, the connection portions 26x are used as the lands.

Then, the external connection terminals 27 (solder balls or lead pins) on the circuit substrate 1 or the connection portions 26x (lands) of the second wiring patterns 26a are connected into the wiring substrate (mother board).

The bumps 25 formed on the carrier copper foil 16 are formed with a high positional precision and at a high density, and also the wiring patterns connected to the bumps 25 are formed with a higher precision on the carrier copper foil 16 side. This is because the planarity of the insulating film becomes worse as the wiring patterns are laminated and thus the upper-side wiring patterns are degraded in precision rather than the lower-side wiring patterns.

Therefore, as shown in FIG. 2, it is convenient for the circuit substrate 1 in the present embodiment to utilize the bumps 25 as connection terminals that are connected to the electronic parts having the high-density connection portions thereon.

Alternately, conversely to the mode in FIG. 2, the bumps of the electronic parts such as the semiconductor chip, or the like may be connected to the connection portions 26x of the second wiring patterns 26a, and the bumps 25 of the circuit substrate 1 may be connected to the wiring substrate (mother board).

In the present embodiment, the carrier copper foil 16 are illustrated as the metallic foil made of the first metal and also the solder layers 24 are illustrated as the metal layer made of the second metal. But the present invention is not limited to this combination. Any combination of metal materials may be employed if the first metal can be selectively removed with respect to the second metal.

Also, such a mode is illustrated that the base substrate 20 in which the carrier-backed copper foil 18 is pasted onto both surfaces of the resin substrate 10 is used and then the build-up wiring is formed on both surfaces sides thereof respectively. But the base substrate 20 in which the carrier-backed copper foil 18 is pasted onto one surface of the resin substrate 10 may be used and then the build-up wiring may be formed on one surface thereof. In addition, a plurality of circuit substrates may be derived from one surface of the base substrate 20.

In the present embodiment, the substrate in which the carrier-backed copper foil 18 is pasted onto the resin substrate 10 is used as the base substrate 20 to fabricate the circuit substrate 1. Therefore, the weight reduction can be achieved and the trouble is hard to be caused in the carrying operation during the manufacturing steps.

Also, a thickness of the carrier copper foil 16 is set to 30 to 40 μm, for example, and thus the thickness is reduced remarkably rather than the copper plate (a thickness is 0.4 mm) used in the prior art. Therefore, an amount etched can be reduced largely and reduction in cost can be attained.

In addition, unlike the prior art in which two sheets of copper plate whose peripheral portions are pasted together are used as the base substrate, no portion of the base substrate 20 is disposed and thus the overall area of the base substrate 20 can be utilized effectively. Therefore, the productivity can be improved.

Second Embodiment

Figure 3A:
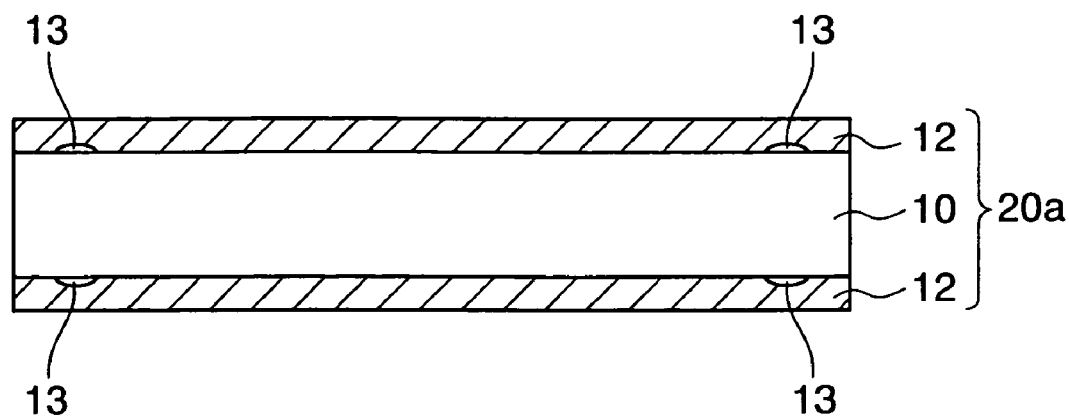
FIGS. 3A to 3I are sectional views showing a circuit substrate manufacturing method according to a second embodiment of the present invention (FIG. 3B is a plan view showing the same)
Figure 3B:
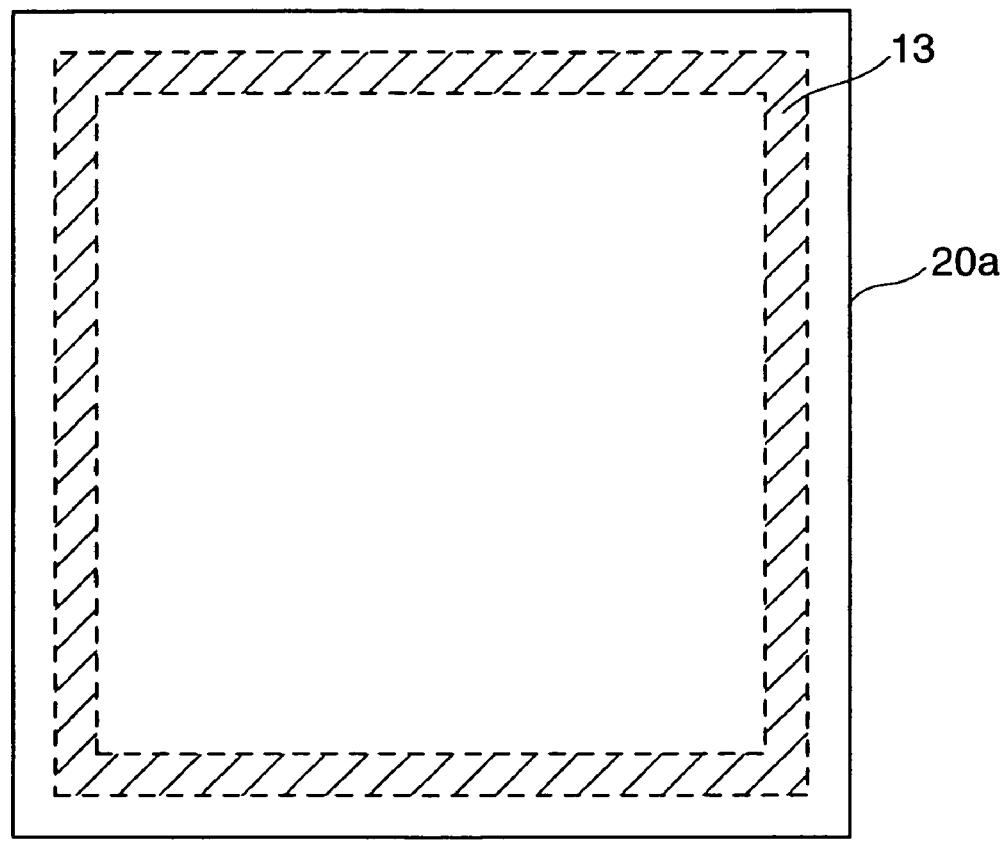

FIGS. 3A to 3I are sectional views showing a circuit substrate manufacturing method according to a second embodiment of the present invention (FIG. 3B is a plan view showing the same). A difference of the second embodiment from the first embodiment resides in that a substrate in which one copper foil layer is formed in a releasable state on the resin substrate is used as the base substrate and that the copper foil is not removed finally but the copper foil is used as the wiring pattern.

In the circuit substrate manufacturing method according to the second embodiment, as shown in FIG. 3A, first the resin substrate 10 similar to that in the first embodiment is prepared. Then, the copper foil 12 of 10 to 40 μm thickness, for example, is pasted onto both surfaces of the resin substrate 10 via an adhesive layer 13 respectively. Then, while also referring to a plan view in FIG. 3B, the adhesive layer 13 is not provided to the overall area of the resin substrate 10 but such adhesive layer 13 is provided selectively to a ring-like area (a hatched portion in FIG. 3B) on the peripheral side of the resin substrate 10. That is, the resin substrate 10 and the copper foil 12 are brought into their simply contact condition in the area except the area to which the adhesive layer 13 is provided.

In the second embodiment, the resultant structure in FIG. 3A is used as a base substrate 20a. The base substrate 20a is constructed by providing the copper foil 12 on both surfaces of the resin substrate 10. Therefore, like the first embodiment, the weight reduction can be achieved rather than the prior art to facilitate the handling of the base substrate 20a and thus generation of the trouble in the carrying operation can be prevent.

Figure 3C:
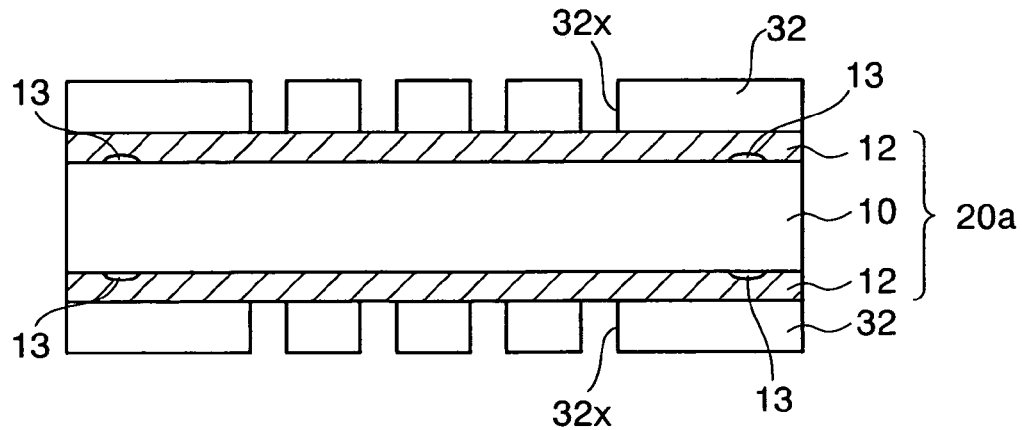

Then, as shown in FIG. 3C, an insulating film 32 in which opening portions 32x are provided is formed on the copper foil 12 on both surface sides of the base substrate 20a respectively. Thus, the copper foil 12 is exposed from bottom portions of the opening portions 32x in the insulating film 32. Such insulating film 32 may be formed by the same material and method as those of the first insulating film 22 in the first embodiment.

Figure 3D:
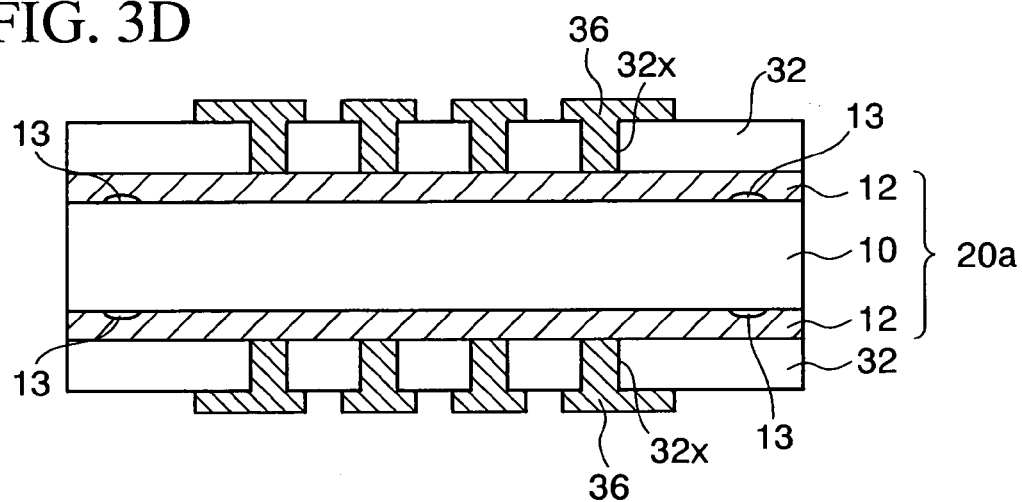

Then, as shown in FIG. 3D, first wiring patterns 36 that are connected electrically to the copper foil 12 via the opening portions 32x in the insulating film 32 are formed on the insulating film 32 on both surface sides of the base substrate 20a respectively by the semi-additive process explained in the first embodiment, or the like. In this case, the n-layered (n is an integer that is 1 or more) wiring pattern may be laminated on the insulating film 32 on both surface sides of the base substrate 20a respectively.

Figure 3E:
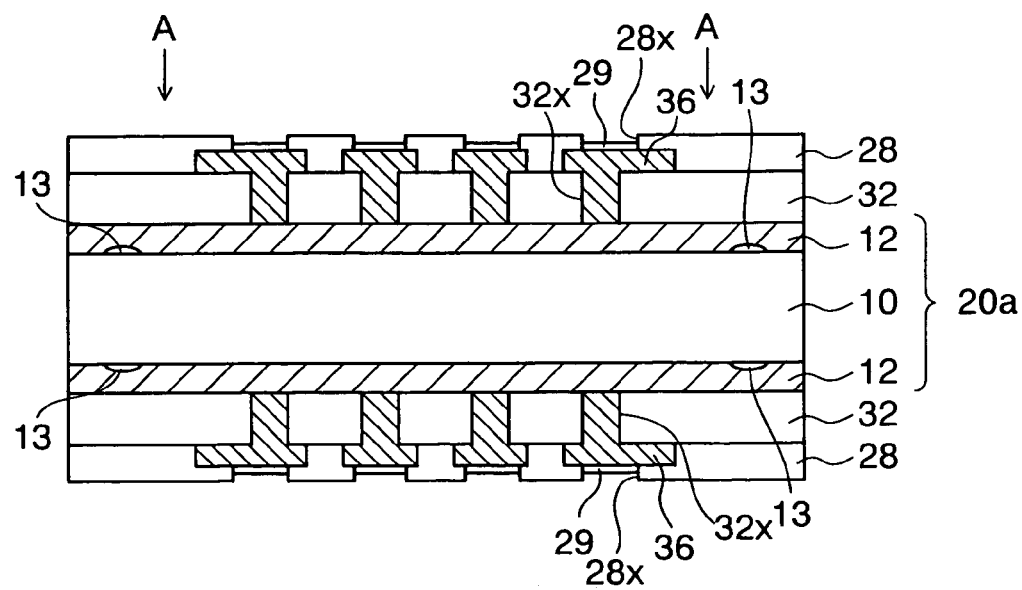

Then, as shown in FIG. 3E, the solder resist film 28 in which the opening portions 28x are provided on the first wiring patterns 36 respectively is formed on both surface sides of the base substrate 20a respectively. Then, connection portions 29 are formed by applying the Ni/Au plating onto the first wiring patterns 36 in the opening portions 28x in the solder resist film 28.

Then, the portion indicated by A in FIG. 3E (equivalent to the ring-like portion that is located inner than the adhesive layer 13 in FIG. 3B) is cut out. Thus, as shown in FIG. 3F, the peripheral portion including the adhesive layer 13 of the base substrate 20a is removed from the resultant structure in FIG. 3E.

Figure 3F:
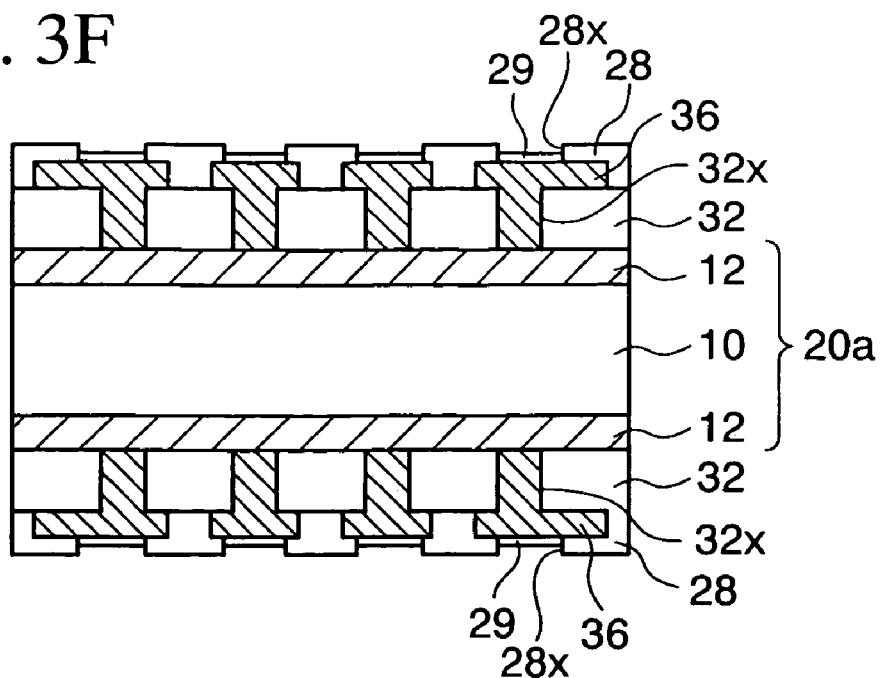

In this stage, since the area in which the adhesive layer 13 is formed is removed in the resultant structure in FIG. 3F, the resin substrate 10 and the copper foil 12 simply come into contact with each other over the entire area. Thus, the resin substrate 10 and the copper foil 12 can be brought into an easy-separate condition.

Figure 3G:
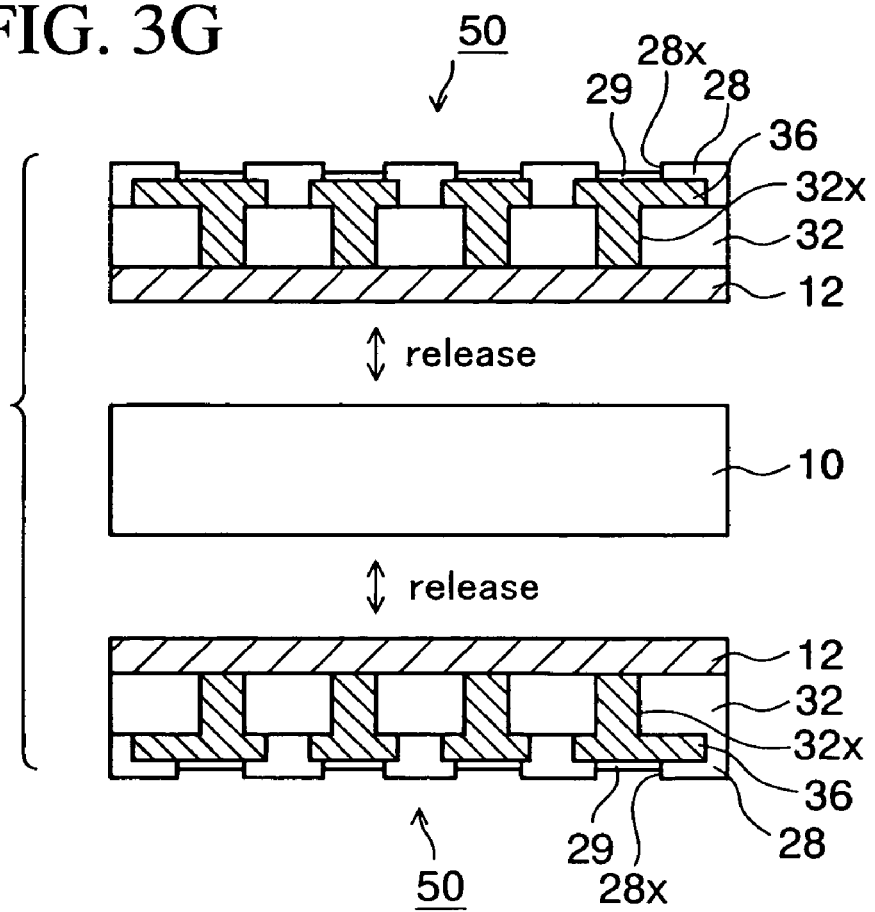

Then, as shown in FIG. 3G, the resin substrate 10 and the copper foil 12 are separated by releasing them at a boundary. Thus, two circuit members 50 can be obtained. The circuit member 50 is composed of the copper foil 12, the insulating film 32, the first wiring patterns 36 connected to the copper foil 12 via the opening portions 32x, and the solder resist film 28. Then, the resin substrate 10 is disposed.

Figure 3H:
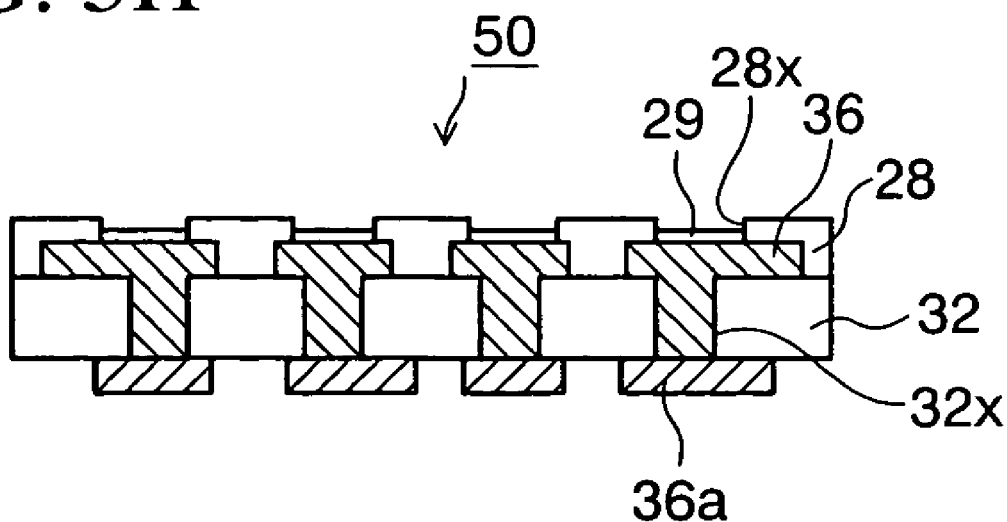
Figure 3I:
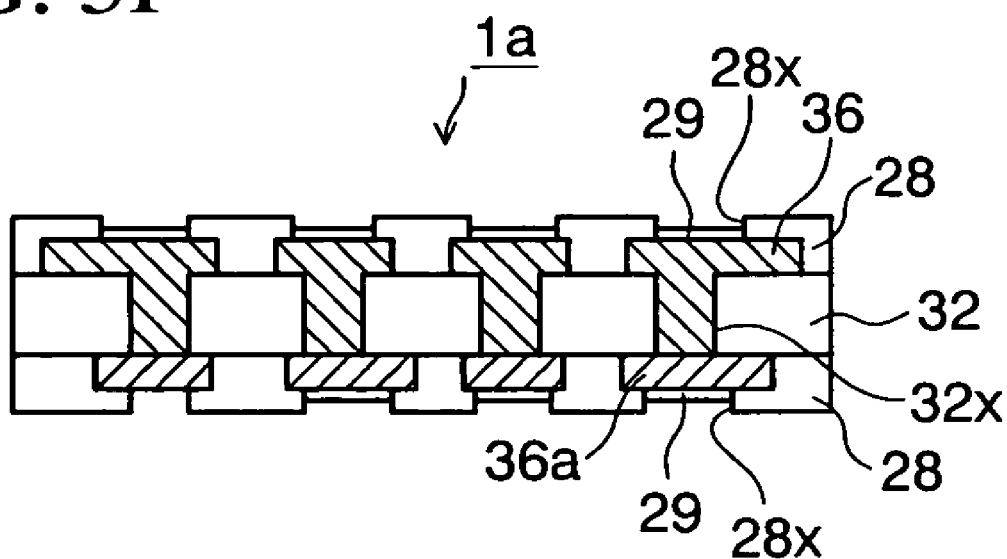

Then, as shown in FIG. 3H, second wiring patterns 36a are formed by patterning the copper foil 12 on one surface of the circuit member 50 by virtue of the photolithography and the etching. The second wiring patterns 36a are connected electrically to the first wiring patterns 36 via the opening portions 32x in the insulating film 32. Then, as shown in FIG. 3I, the solder resist film 28 in which the opening portions 28x are provided on the second wiring patterns 36a is formed on the bottom surface side of the circuit member 50 in FIG. 3H. In addition, the connection portions 29 are formed by applying the Ni/Au plating onto the second wiring patterns 36a in the opening portions 28x in the solder resist film 28.

With the above, a circuit substrate 1a in the second embodiment is obtained.

In this case, the build-up wiring may be formed on one surface of the base substrate in which the copper foil 12 is provided to one surface of the resin substrate 10. In addition, a plurality of circuit substrates may be derived from one surface of the base substrate 20a.

In the circuit substrate 1a according to the present embodiment, preferably the connection portions 29 on the first wiring patterns 36 of the circuit substrate 1a act as the external connection portions connected to the wiring substrate (mother board), and the electronic parts (not shown) such as the semiconductor chip, or the like is connected to the connection portions 29 on the second wiring patterns 36a. On the contrary, the electronic parts (not shown) such as the semiconductor chip, or the like may be connected to the first wiring patterns 36 of the circuit substrate 1a, and the connection portions 29 on the second wiring patterns 36a may act as the external connection portions.

As explained as above, according to the second embodiment, first the predetermined build-up wiring is formed on the copper foil 12 that is pasted to the resin substrate 10 via the adhesive layer 13 provided to the peripheral portion of the resin substrate. Then, the peripheral portion of the resin substrate 10 containing the adhesive layer 13 is cut off and removed. Then, the resin substrate 10 and the copper foil 12 are released at their boundary, whereby the circuit member 50 in which the build-up wiring is provided to one surface and the copper foil 12 is provided to the other surface is obtained. Then, the copper foil 12 of the circuit member 50 is patterned.

In the second embodiment, the substrate in which the copper foil 12 is provided onto the resin substrate 10 is used as the base substrate 20a based on the technical concept or idea similar to the first embodiment. Therefore, like the first embodiment, the weight reduction of the base substrate 20a can be achieved and generation of the carrying trouble in the manufacturing steps can be prevented.

In addition, in the second embodiment, unlike the first embodiment, the copper foil 12 is not removed finally but utilized as the second wiring patterns 36a. Therefore, the reduction in cost can be attained from the viewpoint that the copper foil 12 can be utilized effectively rather than the first embodiment. In addition, the resin substrate (supporting plate) 10 is disposed after it is separated from the copper foil 12. Therefore, since there is no necessity that the supporting metal plate should be removed by the etching like the prior art, the manufacturing steps can be simplified and also a production cost can be reduced.

Further, in the second embodiment, the resin substrate 10 on which the copper foil 12 consisting of one layer is pasted is used as the base substrate 20*a*. Therefore, the structure of the base substrate can be simplified rather than the first embodiment.

Third Embodiment

FIGS. 4A to 4F are sectional views showing a circuit substrate manufacturing method according to a third embodiment of the present invention sequentially. A difference of the third embodiment from the second embodiment resides in that a substrate in which the copper foil is pasted onto the resin substrate via the released layer is used as the base substrate.

Figure 4A:
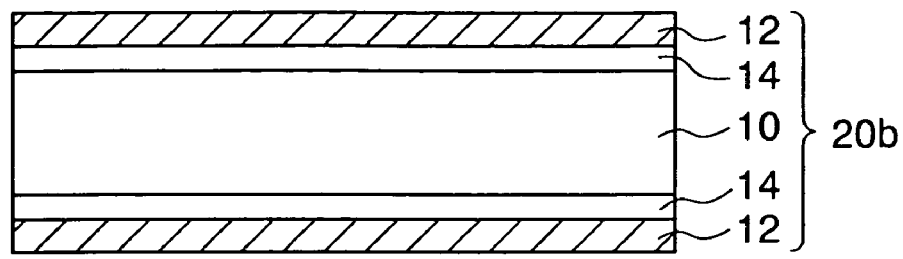
FIGS. 4A to 4F are sectional views showing a circuit substrate manufacturing method according to a third embodiment of the present invention.

According to the circuit substrate manufacturing method according to the third embodiment, as shown in FIG. 4A, first a base substrate 20*b* having such a structure that the copper foil 12 is pasted onto both surface sides of the resin substrate 10 via the released layer 14 is prepared. The released layer 14 is made of silicone, or the like, and is formed such that the released layer 14 and the copper foil 12 are easily released at the boundary between them in the later step.

Figure 4B:
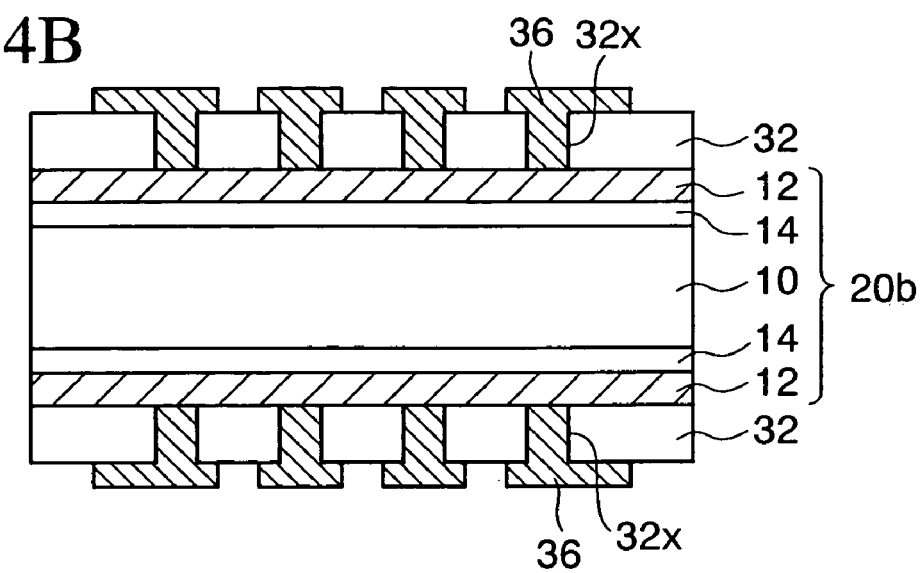

Then, as shown in FIG. 4B, the insulating film 32 in which the opening portions 32*x* are provided is formed on the copper foil 12 on both surface sides of the base substrate 20*b* respectively by the same method as the first embodiment. Then, the first wiring patterns 36 connected electrically to the copper foil 12 via the opening portions 32*x* are formed respectively.

Figure 4C:
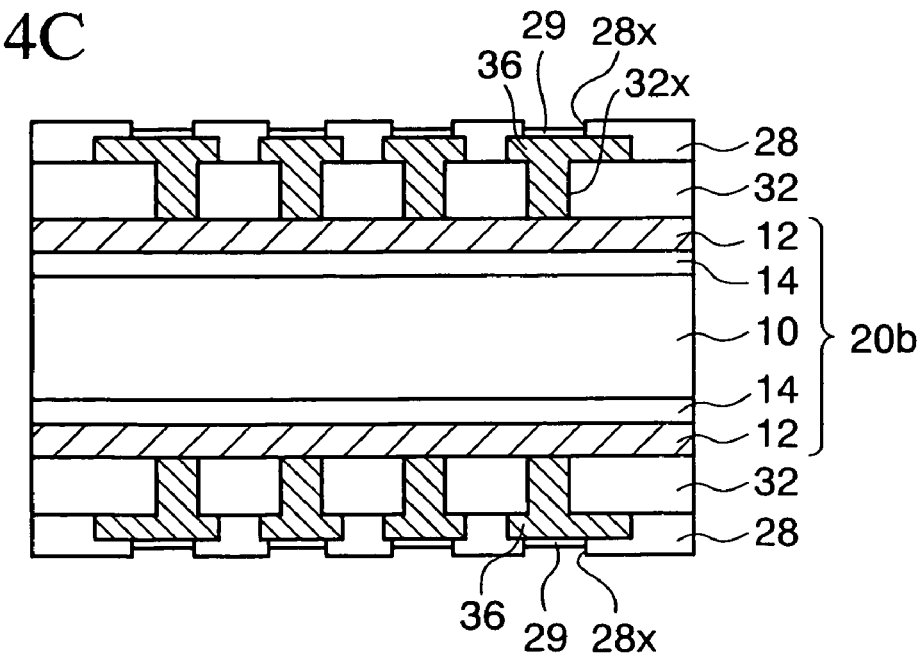

Then, as shown in FIG. 4C, like the second embodiment, the solder resist film 28 in which the opening portions 28*x* are provided on the first wiring patterns 36 respectively is formed on both surface sides of the base substrate 20*b* respectively. Then, the connection portions 29 are formed respectively by applying the Ni/Au plating onto the first wiring patterns 36 in the opening portions 28*x*.

Figure 4D:
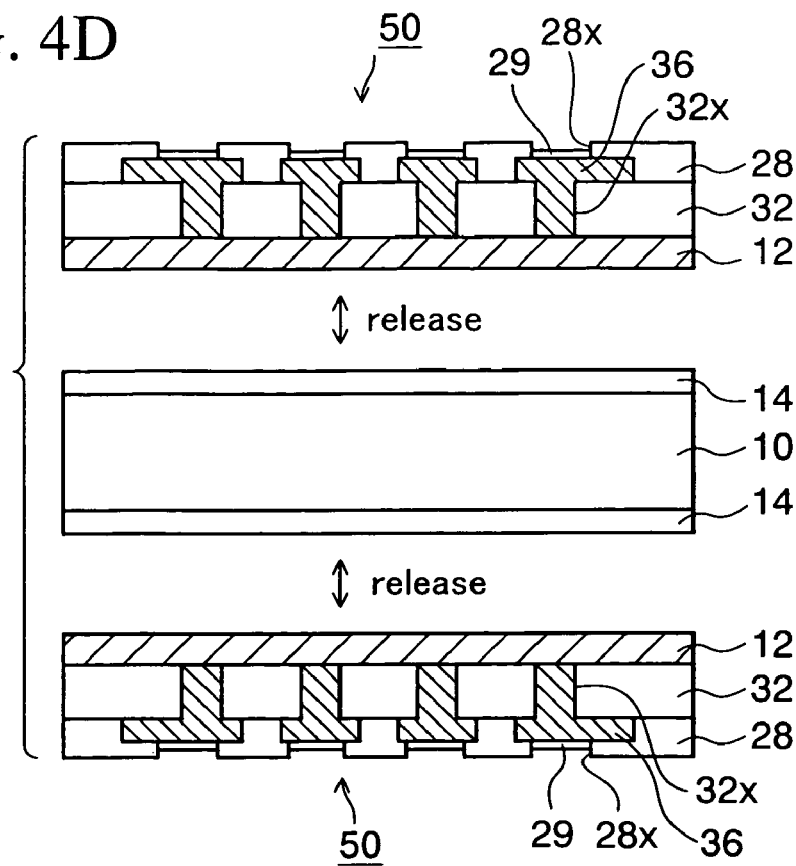

Then, as shown in FIG. 4D, the released layer 14 and the copper foil 12 are released mutually at the boundary and thus two circuit members 50 are obtained. Then, the resin substrate 10 on which the released layer 14 is left is disposed.

Figure 4E:
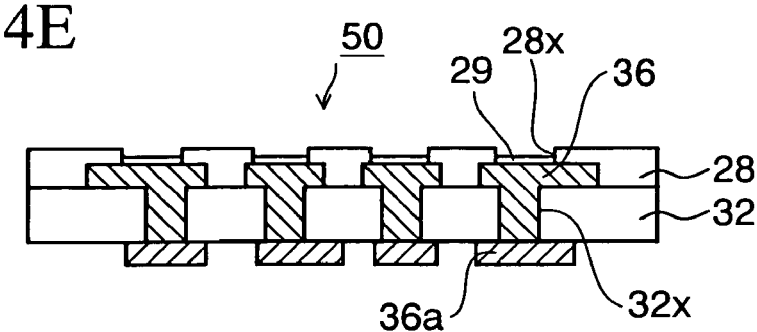

Then, as shown in FIG. 4E, the second wiring patterns 36*a* that are connected to the first wiring patterns 36 via the opening portions 32*x* in the insulating film 32 are formed by patterning the copper foil 12 of the circuit member 50.

Figure 4F:
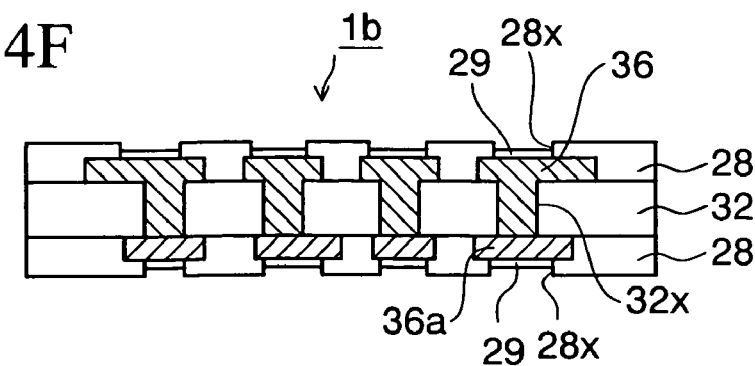

Then, as shown in FIG. 4F, the solder resist film 28 in which the opening portions 28*x* are provided onto the second wiring patterns 36*a* is formed on the bottom surface side of the circuit member 50 in FIG. 4E. Then, the connection portions 29 are formed respectively on the second wiring patterns 36*a* in the opening portions 28*x*.

With the above, a circuit substrate 1*b* in the third embodiment is obtained.

The third embodiment can achieve the similar advantages to those in the first and second embodiments. In addition, in the third embodiment, because the substrate in which the copper foil 12 is pasted onto the resin substrate 10 via the released layer 14 is used as the base substrate 20*b*, the released layer 14 and the copper foil 12 can be released easily at the boundary. Therefore, unlike the second embodiment, there is no necessity that the peripheral portion of the base portion 20*b* should be cut off to separate the resin substrate 10 and the copper foil 12. As a result, the manufacturing steps can be made simply and a production cost can be reduced much more.

In the above second and third embodiments, in place of the copper foil 12 utilized as the wiring pattern, the concave portions may be provided in the copper foil 12 like the carrier copper foil 16 in the first embodiment, and may be utilized in forming the bumps.

What is claimed is:

1. A circuit substrate manufacturing method comprising the steps of:
   preparing a substrate on which a metallic foil is formed in a releasable state on at least one surface of the substrate, a peripheral portion of said metallic foil being selectively pasted on the substrate by an adhesive layer which is selectively arranged with a ring shape on a peripheral portion of the substrate or the metallic foil;
   forming an insulating film in which opening portions are provided on the metallic foil;
   forming first wiring patterns, which are electrically connected to the metallic foil via the opening portions, on the insulating film;
   obtaining a circuit member, which is constructed by the metallic foil, the insulating film, and the first wiring patterns, by cutting and removing an entire peripheral portion of the substrate containing the adhesive layer and then separating the metallic foil from the substrate; and
   forming second wiring patterns, which are connected electrically to the first wiring patterns via the opening portions in the insulating film, on an opposite surface of the insulating film to a surface, on which the first wiring patterns are formed, by patterning the metallic foil of the circuit member.

2. A circuit substrate manufacturing method according to claim 1, wherein the substrate is formed of resin.

3. A circuit substrate manufacturing method according to claim 1, wherein, in the step of forming the first wiring patterns on the insulating film, the wiring patterns are formed by laminating wiring patterns in n-layers wherein, n is an integer that equal to or greater than is 1).

4. A circuit substrate manufacturing method according to claim 1, wherein the substrate on which the metallic foil is formed in a releasable state is such a substrate that a released layer is interposed between the substrate and the metallic foil, and
   the step of obtaining the circuit member includes releasing the released layer and the metallic foil at a boundary.

\* \* \* \* \*